United States Patent [19]

Nishiguchi

[11] Patent Number: 5,064,782

[45] Date of Patent: Nov. 12, 1991

[54] METHOD OF ADHESIVELY AND HERMETICALLY SEALING A SEMICONDUCTOR PACKAGE LID BY SCRUBBING

[75] Inventor: Masanori Nishiguchi, Yokohama, Japan

[73] Assignee: Sumitomo Electric Industries, Ltd., Osaka, Japan

[21] Appl. No.: 505,591

[22] Filed: Apr. 6, 1990

[30] Foreign Application Priority Data

Apr. 17, 1989 [JP] Japan .................................. 1-96811

[51] Int. Cl.$^5$ .................... H01L 21/603; H01L 23/10
[52] U.S. Cl. ..................................... 437/216; 174/52.5
[58] Field of Search ................. 174/50, 51, 52.1, 52.5, 174/52.3, 52.4, 52.5; 437/215, 216, 218, 221, 222, 927, 209; 228/193, 194, 195, 263.12, 263.13, 112, 2, 243, 43, 44.3, 48, 49.1; 357/74

[56] References Cited

U.S. PATENT DOCUMENTS 3,711,939  1/1973  Stoll ..................................... 357/74

FOREIGN PATENT DOCUMENTS 57-17275  4/1982  Japan .................................. 437/209
58-52855  5/1983  Japan .................................. 437/218

OTHER PUBLICATIONS

IBM Technical Disclosure Bulletin; vol. 20, No. 4, 9/77, G. Dumaine et al.

Primary Examiner—Olik Chaudhuri
Assistant Examiner—David E. Graybill
Attorney, Agent, or Firm—Stevens, Davis, Miller & Mosher

[57] ABSTRACT

A semiconductor device package is disclosed which includes (1) a carrier body which is to be mounted with a semiconductor device chip and which has an annular adhesion layer formed thereon, (2) a cap which is to be adhered to the carrier body to hermetically seal the carrier body, and (3) an adhesive which is applied between the adhesion layer of the carrier body and the cap and which becomes hardened after at least one of the carrier body and the cap is pivoted about an axis coaxial with the annular adhesion layer to eliminate voids in the adhesive and to improve the sealing properties of the package.

3 Claims, 4 Drawing Sheets

METHOD OF ADHESIVELY AND HERMETICALLY SEALING A SEMICONDUCTOR PACKAGE LID BY SCRUBBING

BACKGROUND OF THE INVENTION

1. Field of the Invention

The present invention relates to a semiconductor device package and a sealing apparatus and method therefor and, more particularly, to a system for hermetic sealing of a semiconductor device chip together with an inert gas in a package body upon adhesion of a lid to the package body with an adhesive.

2. Related Background Art

A semiconductor device package generally comprises a rectangular package body and a rectangular lid adhered thereto. In a conventional semiconductor device package, an adhesive is applied to an adhesion layer (plating layer) of a package body, a lid is urged against a package body while the entire structure is being heated to perform an adhesion operation. By this operation, hermetic sealing of the package body can be achieved, and the semiconductor device chip is sealed in the package. In this case, a sealing solder is generally used as an adhesive.

The hermetic sealing of the package is performed to protect semiconductor device chips from contamination sources (e.g., dust, chemicals, gases, and humidity), which adversely affect the semiconductor device chip, and from mechanical damage. Each semiconductor device chip must be, therefore, sealed in a package with an inert gas and must be protected by the inert gas.

In a conventional method of adhering a lid with an adhesive while being heated under pressure, voids tend to be left in a hermetic seal portion, as an overlapping portion between the lid and the plating layer (adhesion layer) of the package body. A sealed gas inside the package tends to leak through the seal portion, thus causing sealing defects.

The width of the seal portion must be minimized in consideration of swelling of the adhesive. In a recent compact package in which a LN (Low-Noise) FET or the like is mounted, the seal portion is getting short. For this reason, seal portion defects tend to occur frequently and become a cause for decreasing semiconductor device product yields.

SUMMARY OF THE INVENTION

It is a first object of the present invention to provide a semiconductor device package capable of reducing defects in a seal portion between a package body and a lid.

It is a second object of the present invention to provide a sealing apparatus for a semiconductor device package, capable of improving the adhesion strength between the package body and the lid.

It is a third object of the present invention to provide a sealing method for a semiconductor device package, capable of improving the uniformity of the eutectic reaction by performing scrubbing to break the surface oxide film formed on the preform such as Au;Sn.

In order to achieve the first object of the present invention, there is provided a semiconductor device package comprising: a package body in which a semiconductor device chip is mounted; a lid adhered to the package body for hermetic sealing of the package body; an annular adhesion layer being formed on the package body, with the adhesion between the package body and the lid being achieved by applying an adhesive between the annular adhesion layer and the lid, and with the applied adhesion hardening after at least one of the package body and the lid is pivoted about an axis coaxial with the adhesion layer.

In order to achieve the second object of the present invention, there is provided a sealing apparatus for a semiconductor device package, for hermetically sealing a package body mounted with a semiconductor device chip after a lid is adhered to an annular adhesion layer formed on the package body by using an adhesive, comprising: a table for supporting the package body; a lid holding jig for holding the lid; urging means for vertically moving the table and/or the lid holding jig such that at least one of the package body and the lid urges the other of the package body and the lid; and means for rotating the table and/or lid holding jig such that at least one of the package body and the lid is rotated to be coaxial with the annular adhesion layer.

In order to achieve the third object of the present invention, there is provided a sealing method for a semiconductor device package, comprising: a first step of mounting a semiconductor device chip on a package body having an annular adhesion layer formed thereon and of applying an adhesive to the adhesion layer; a second step of urging at least one of the package body and lid for hermetically sealing the package body against the other of the package body and the lid; and a third step of rotating at least one of the package body and the lid to be coaxial with the adhesion layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

A compact ceramic package according to an embodiment of the present invention will be described with reference to FIGS. 1 to 3b.

Figure 1:
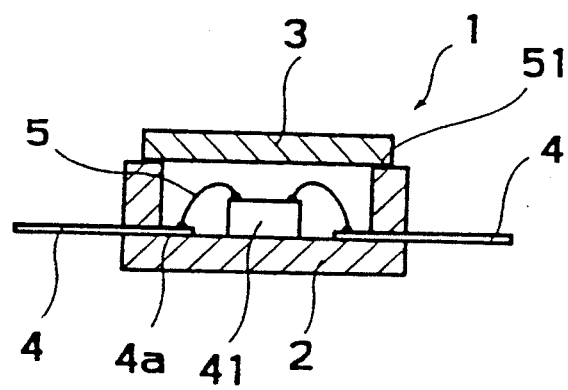
FIG. 1 is a sectional side view of a semiconductor device package according to an embodiment of the present invention.
Figure 2:
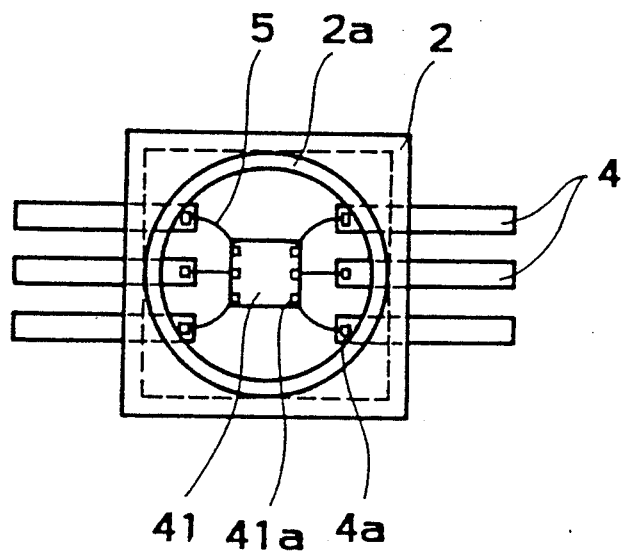
FIG. 2 is a plan view showing a package body for a semiconductor device package according to the embodiment shown in FIG. 1.
Figure 3:
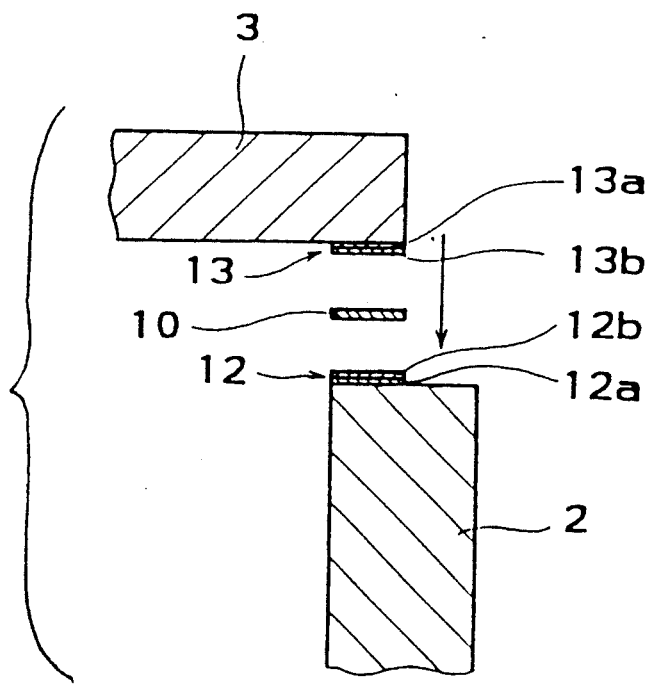
FIGS. 3a and 3b are enlarged sectional views showing an adhesion state between a lid and a package body in the semiconductor device package shown in FIG. 1.
Figure 3:
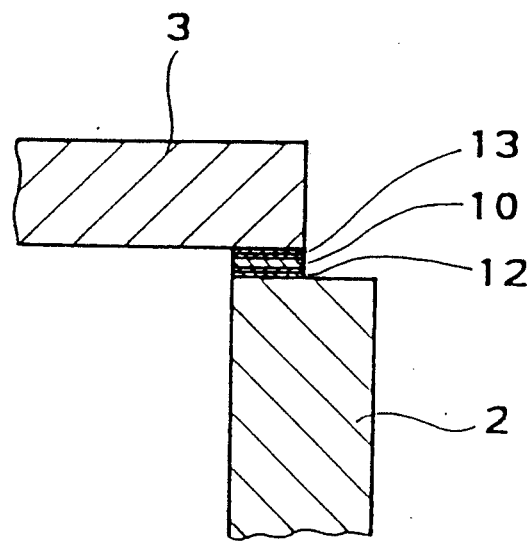

As shown in FIGS. 1 and 2, a package 1 comprises a package body 2 for carrying a semiconductor device chip 41 and a lid 3 for sealing the semiconductor device chip 41 in the package body 2. This hermetic seal is acheived by adhering the lid 3 to the package body 2. Six leads are separately provided on the both sides of the package body 2. Each lead 4 is formed by coating gold (Au) on an iron-nickel (Fe/Ni) alloy plate. The distal end of an inner lead 4a of each lead 4 and each bonding pad 41a of the semiconductor device chip 41 are electrically connected by the wire bonding of an Au wire 5.

As shown in FIGS. 3a and 3b, an annular plating layer 12 constituting an adhesion layer for adhering the lid 3 is formed on the upper edge of the package body 2. The plating layer 12 comprises a nickel (Ni) plating layer 12a and a gold (Au) plating layer 12b formed on the Ni plating layer 12a. Similarly, an annular plating layer 13 consisting of an Ni plating layer 13a and an Au plating layer 13b is formed on the lower edge of the lid 3. Prior to sealing of the package body 2, a seal-like adhesive (sealing solder) 10 is placed on the plating layer 12. The adhesive 10 consists of a eutectic alloy such as a gold/tin (Au/Sn) alloy. The plating layer 12 has almost the same shape as the plating layer 13.

The package body 2 is adhered to the lid 3 as follows. The adhesive 10 is interposed between the plating layers 12 and 13, and the plating layer 12 of the package body 2 is urged against the plating layer 13 of the lid 3 while the lid 3 is being heated. In this case, the adhesive 10 is melted between the plating layers 12 and 13 to form an annular seal portion 2a consisting of eutectic bonds. In this state, at least one of the package body 2 and the lid 3 is pivoted relative to an axis which is coaxial with the plating layers 12 and 13, thereby completing adhesion. By this pivotal movement, the plating layer 12 of the package body 2 can be perfectly adhered to the plating layer 13 of the lid 3 to eliminate voids from the seal portion 2a.

The outer dimensions of the lid 3 are slightly smaller than those of the package body 2. Therefore, sagging of the molten adhesive 10 and projections of the hardened adhesive on the side surfaces of the package body 2 can be prevented.

A package sealing apparatus according to the embodiment of the present invention will be described with reference to FIGS. 4 and 5.

This package sealing apparatus comprises a table 21 and a collet 22 including a heating element. The package body 2 is placed at the center of the table 21, and the lid 3 is held by the collet 22. The table 21 is arranged to be rotatable, and the lower surface of the table 21 is connected to a link mechanism 23 eccentric from a rotating shaft 21a of the table 21. The link mechanism 23 comprises an arm 24 and a disc 25. A motor 26 is connected to the disc 25 to rotate the disc 25. The link mechanism 23 is driven upon rotation of the motor 26, and then the table 21 is rotated. In this embodiment, the motor 26 is rotated by two revolutions, and the table 21 is then reciprocated twice within an angle of 30°.

A recessed chuck portion 22a is formed in the lower surface of the collet 22. The chuck portion 22a is connected to a vacuum pump 27. The lid 3 is chucked in vacuum by the chuck portion 22a of the collet 22 and is conveyed onto the package body 2. A hydraulic actuator 28 is connected to the upper end of the collet 22, and the lid 3, which has been conveyed onto the package body 2, is urged against the package body 2 by the hydraulic actuator 28 during adhesion. In addition, since the collet 22 includes a heating element, the lid 3 is heated to be 300° C. during adhesion.

The package body 2 and the lid 3 which are set on the table 21 are stored together with the lower portion of the collet 22 in a chamber 29 provided on the table 21. Nitrogen gas ($N_2$) or a mixture of nitrogen and hydrogen gases ($N_2 + H_2$) is supplied to the chamber 29 as a sealing gas. The adhesion operation is performed in an inert gas (sealing gas) atmosphere. When the package body 2 is hermetically sealed by the above-described adhesion operation, the semiconductor device chip 41 sealed inside the package 1 is kept in an inert condition by such a sealing gas.

Figure 4:
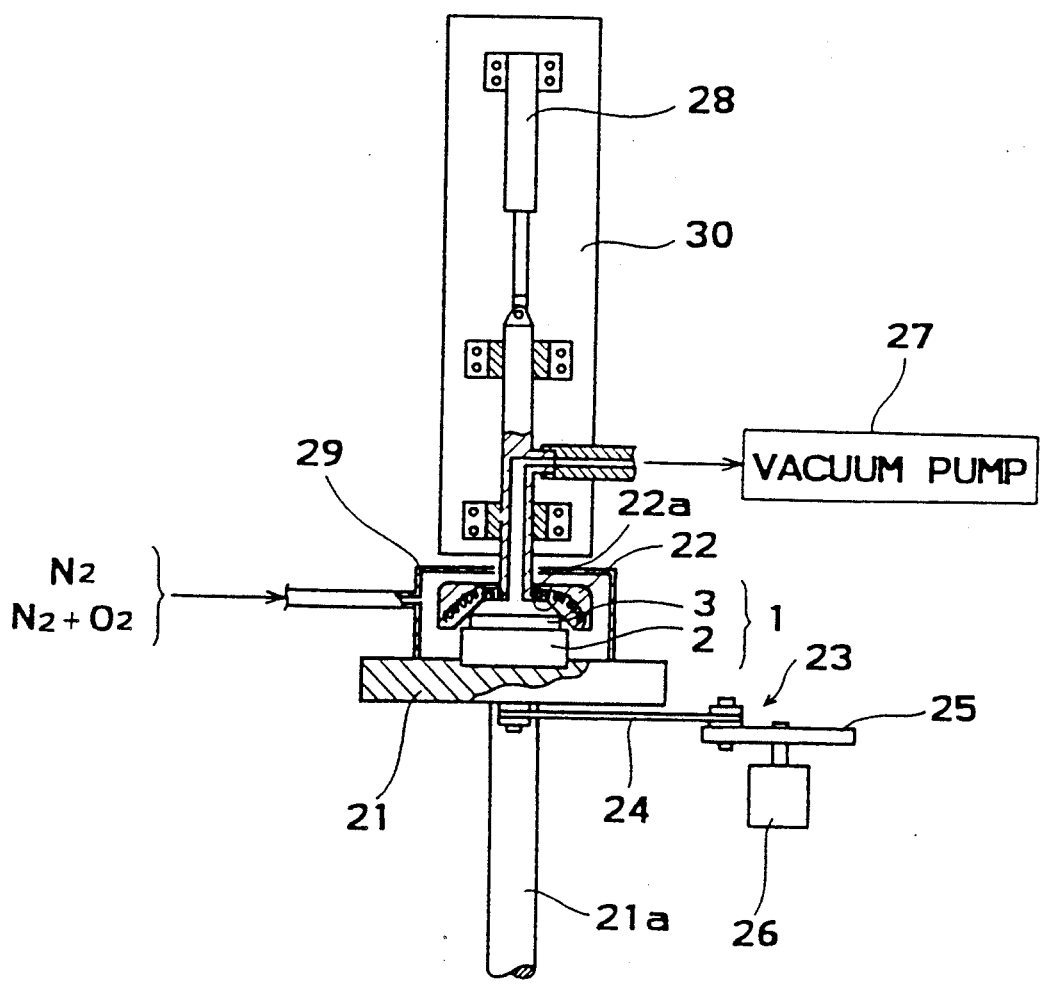
FIG. 4 is a partially sectional side view of a sealing apparatus for a semiconductor device package according to the embodiment of the present invention.
Figure 5:
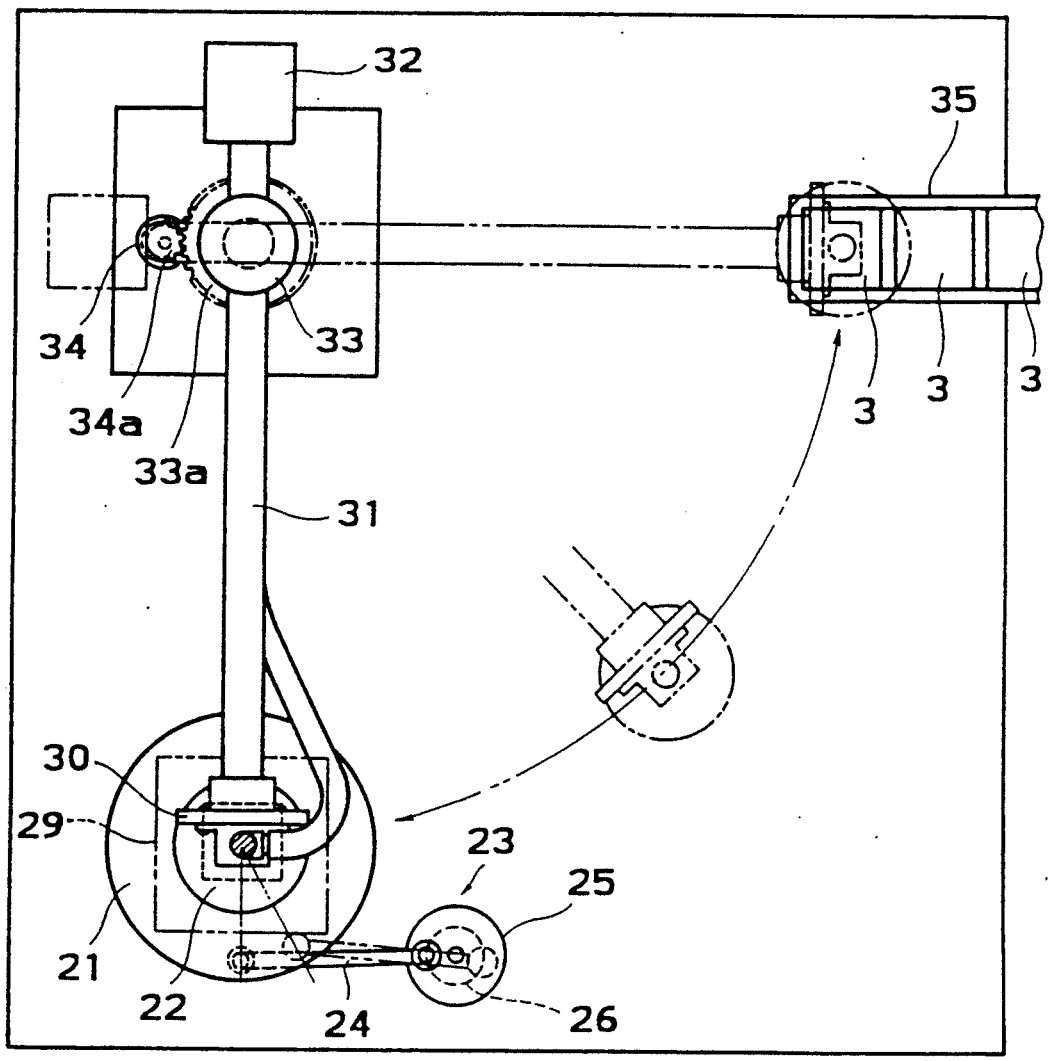
FIG. 5 is a plan view showing an overall structure of the sealing apparatus for a semiconductor device package according to the embodiment of the present invention.

As shown in FIG. 4, the collet 22 and the hydraulic actuator 28 are fixed on a support plate 30. This support plate 30 is mounted at the distal end of a support arm 31 shown in FIG. 5. The support arm 31 is fixed on a vertical pivot shaft 33, and a counterbalance 32 is mounted at the base end portion of the pivot shaft 33. A gear 33a is formed at the lower portion of the vertical pivot shaft 33 and is meshed with an output gear 34a of a drive motor 34. Upon forward or reverse rotation of the drive motor 34, the support arm 31 is pivoted between a position of the table 21 and a feed position of the lid 3. A conveyance path 35 is formed at the feed position of the lid 3, so that the lid 3 is continuously fed along the convey path 35.

An operation of the package sealing apparatus will be described below.

The collet 22 which receives the lid 3 at the position of the conveyance path 35 is moved to the position of the table 21 by the drive motor 34. The package body 2 having the adhesive 10 is placed on the table 21. The collet 22 is driven to coaxially align the plating layer 13 of the lid 3 with the plating layer 12 of the package body 2. When this positioning is completed, the hydraulic actuator 28 is driven to move the collet 22 downward, thereby covering the lid 3 on the package body 2 so as to interpose the adhesive 10 between the plating layers 12 and 13. Meanwhile, the lid 3 and the adhesive 10 are heated to 300° C. by the collet 22, and $N_2$ gas or the like is supplied to the chamber 29. The lid 3 is urged against the package body 2 by the hydraulic actuator 28. When the adhesive 10 is melted by heat, the table 21 is pivotally reciprocated twice about shaft 21a within the above-discussed 30° angle, thereby completing the adhesion operation.

When the plating layers 12 and 13 have an annular shape and the package body 2 is reciprocatingly pivoted twice during adhesion, the plating layers 12 and 13 are perfectly adhered to each other. As a result, voids can be eliminated from the seal portion 51, and a sealing property of the package 1 can be improved.

In this embodiment, the package body 2 has a size of 1.5 mm × 1.5 mm, and each of the plating layers 12 and 13 has an outer diameter of 1.3 mm and an inner diameter of 1.1 mm. A preformed body of an Au/Sn eutectic alloy (thickness: 30 μm) is used as the adhesive 10.

In this embodiment, the table 21 is provided. However, the collet 22 may be pivoted. Alternatively, the table 21 and the collet 22 may be pivoted relative to each other.

In this case, as a means for pivoting the table 21 and the collet 22, for example, a stepping motor may be used in place of a link mechanism used in this embodiment.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A sealing method for a semiconductor device package, comprising:
    (a) mounting a semiconductor device chip on a package body having an annular adhesion layer formed thereon, applying an adhesive to said adhesion layer, and thereafter mounting a lid having an annular adhesion layer formed thereon on said package body through a sealing solder film to cause said annular adhesion layer of said package body to overlap said annular adhesion layer of said lid;
    (b) urging at least one of said package body and said lid against the other of said package body and said lid to hermetically seal said package body; and
    (c) pivoting one of said package body and said lid about a substantially central axis of one of said annular adhesion layer of said lid and said annular adhesion layer of said package body.

2. A sealing method for a semiconductor device package according to claim 1, wherein a center of said annular adhesion layer of said package body is substantially aligned with a center of said annular adhesion layer of said lid.

3. A sealing method for a semiconductor device package according to claim 1, wherein said annular adhesion layer of said lid and said annular adhesion layer of said package body are Au/Ni plating layers and said sealing solder film is an Au/Sn alloy.

* * * * *